United States Patent
Trinh

(10) Patent No.: US 7,606,039 B2
(45) Date of Patent: Oct. 20, 2009

(54) ELECTRONIC-COMPONENT HOUSING

(75) Inventor: Dat-Minh Trinh, Barntrup (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 171 days.

(21) Appl. No.: 11/876,874

(22) Filed: Oct. 23, 2007

(65) Prior Publication Data
US 2008/0092604 A1    Apr. 24, 2008

(30) Foreign Application Priority Data
Oct. 24, 2006   (DE) .................. 20 2006 016 486 U

(51) Int. Cl.
*H05K 5/00*   (2006.01)
(52) U.S. Cl. .................... 361/732; 361/759
(58) Field of Classification Search ............... 361/732, 361/759, 756, 683, 727, 801, 788, 802
See application file for complete search history.

(56) References Cited
U.S. PATENT DOCUMENTS

2003/0151903 A1* 8/2003 Brooks et al. ............... 361/756
2004/0252469 A1* 12/2004 Campbell et al. ........... 361/756
2006/0245169 A1* 11/2006 Freimuth et al. ............ 361/729
2008/0019104 A1* 1/2008 Karstens ..................... 361/732
2008/0055866 A1* 3/2008 Chou ......................... 361/732

* cited by examiner

*Primary Examiner*—Dean A. Reichard
*Assistant Examiner*—Yuriy Semenenko
(74) *Attorney, Agent, or Firm*—Bourque and Associates, PA

(57) ABSTRACT

An exemplary Electronic-component housing may be placed onto a carrier rail with two interlocking spars extending longitudinally at a distance from each other and opening toward the longitudinal sides of the rails. An interlocking profile firmly affixed to the housing is positioned on the underside of the housing and across from the interlocking profile. A displaceable securing lock that is spring-loaded toward the interlocking profile. The securing lock may include on its end away from the interlocking profile a shaped drawbar eye for engagement with an actuation tool. The housing side wall above the securing lock and extending upward extends at least with its lower area in a plane perpendicular to the displacement direction of the securing lock and includes in this area a shaped tool-guide channel with its mouth pointed toward the drawbar eye on the securing lock. A wall section intersects at an obtuse angle inclined along the depth direction on the lower area of the housing side wall as far as the securing lock, and into which the lower section of the guide channel is formed as a recess. The outer end of the securing lock including the drawbar eye is recessed in its secured position behind the plane of the lower area of the housing wall.

7 Claims, 4 Drawing Sheets

ELECTRONIC-COMPONENT HOUSING

TECHNICAL FIELD

The invention relates to an electronic-component housing to be placed onto a carrier rail with two interlocking spars extending longitudinally at a distance from each other and opening toward the longitudinal sides of the rails.

BACKGROUND INFORMATION

Matching this, an interlocking profile firmly affixed to the housing is positioned on its underside of the housing, and across from it at a distance is a displaceable securing lock that is spring-loaded toward the interlocking profile. The securing lock includes on its end away from the interlocking profile a shaped drawbar eye for engagement with an actuation tool. The housing side wall above the securing lock and extending upward extends at least with its lower area in a plane perpendicular to the displacement direction of the securing lock, and includes in this area a shaped tool-guide channel with its mouth pointed toward the drawbar eye on the securing lock.

SUMMARY

In the conventional implementation, electronic-component housings possess depth dimensions that are perpendicular to the longitudinal direction of the carrier rails in mounted position such that their lower area is flush with the longitudinal edges of the carrier rails, or project over them. In modern, space-saving wiring systems with conductor brackets on the longitudinal sides of the carrier rails, the conductors are extended along the housing sides extending in the width dimension, whereby actuation of the securing slider is very difficult or impossible in the case of an exchange of the electronic-component housing for the purpose of its release from the carrier rail because one cannot reach the drawbar eye on the securing lock with the actuation tool in the manner that, by means of movement of the tool in the manner of a rocker arm, the securing lock may be retracted from its spring-loaded locking position.

Regarding electronic-component housings of the above-mentioned type, one is thus compelled to omit recesses formed along the depth dimension in the lower area of the housing side wall, so that the circumference contour about the lower side of the housing is approximately rectangular. It is thus possible to keep the depth dimension equal to, or less than, the width of the carrier rails so that the housing side walls of the electronic-component housing placed onto the carrier rail are slightly set back with respect to the carrier rail longitudinal sides. In the secured position, the outer end of the lower-side securing lock lies flush with the housing side wall over it and extending upward. Depending on the density of the described conductor routing, this configuration of the electronic-component housing makes access to the drawbar eye of the securing lock even more difficult.

It is the task of the invention to create an electronic-component housing of the above-described type in which access to the drawbar eye of the securing lock is improved without detracting from the function or actuation of the securing lock.

This task is solved by an electronic-component housing of the type described at the outset in that a wall section intersects at an obtuse angle inclined along the depth direction on the lower area of the housing side wall as far as the securing lock, and into which the lower section of the guide channel is formed as a recess, whereby the outer end of the securing lock including the drawbar eye is recessed in its secured position behind the plane of the lower wall area.

It is essential to the invention that, in spite of additional narrowing in its lower area, the electronic-component housing engages in a conventional manner on a carrier rail and may be removed from it again, since the interlocking profile and the inner end of the securing lock that interacts with the pertinent interlocking spar of the carrier rail remain unaltered in shape and position. However, the securing lock is shortened in its length extending along the displacement direction so that the outer end of the securing lock provided with the drawbar eye is recessed as seen from without behind the plane that is defined by the housing wall extending parallel to the carrier rail and adjacent to the securing lock. In order still to be able to reach the drawbar eye with a tool (a screwdriver blade as a rule), the guide channel formed into the housing side wall in the lower wall section is displaced rearward along the depth dimension to the extent that its mouth is aligned with the recessed drawbar eye on the securing lock.

In order for an actuation tool such as a screwdriver blade better to be able to apply a pulling force to the securing lock when it is engaged with the drawbar eye, at least one spar whose channel cross section becomes smaller toward the longitudinal channel opening is positioned at a distance from the drawbar eye.

In a particularly advantageous embodiment, two of these spars are provided that possess a triangular shape and are positioned at the same channel height across from each other and crosswise to the longitudinal channel dimension, whereby these spars extend between the channel sides and the channel floor, and create a V-shaped opening between them.

In all cases, it is advantageous for the guide channel to possess a rectangular or square cross section.

BRIEF DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENTS

Figure 1:
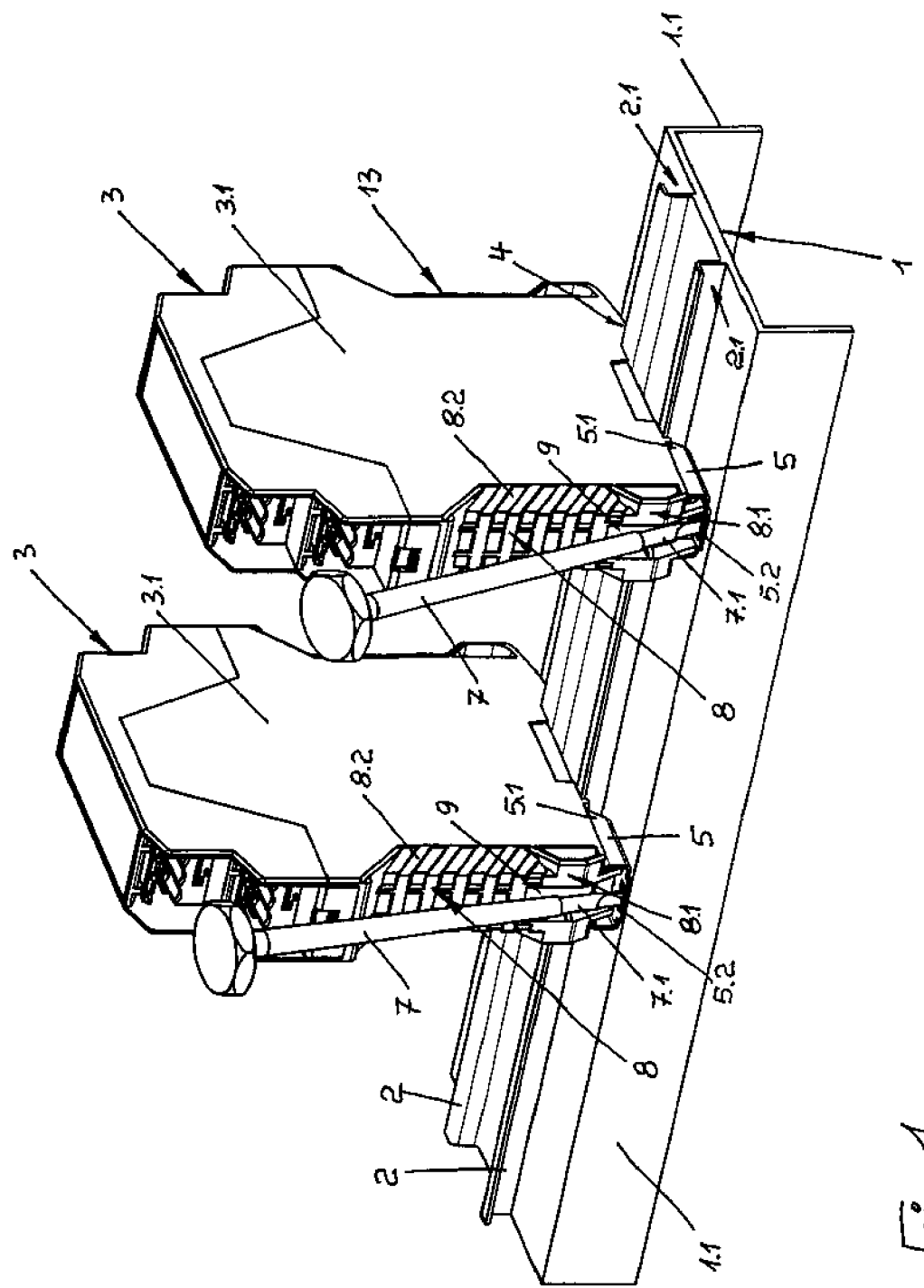
FIG. 1 perspective view of a carrier rail with two electronic-component housings placed on it.

In particular, FIG. 1 shows a carrier rail 1 that includes two interlocking spars 2 on its upper side. The interlocking spars 2 extend along the longitudinal direction of the carrier rail 1. They are positioned at a distance from each other, and each of their longitudinally-extending interlocking apertures 2.1 lies toward the adjacent longitudinal side 1.1 of the carrier rail 1.

Figure 2:
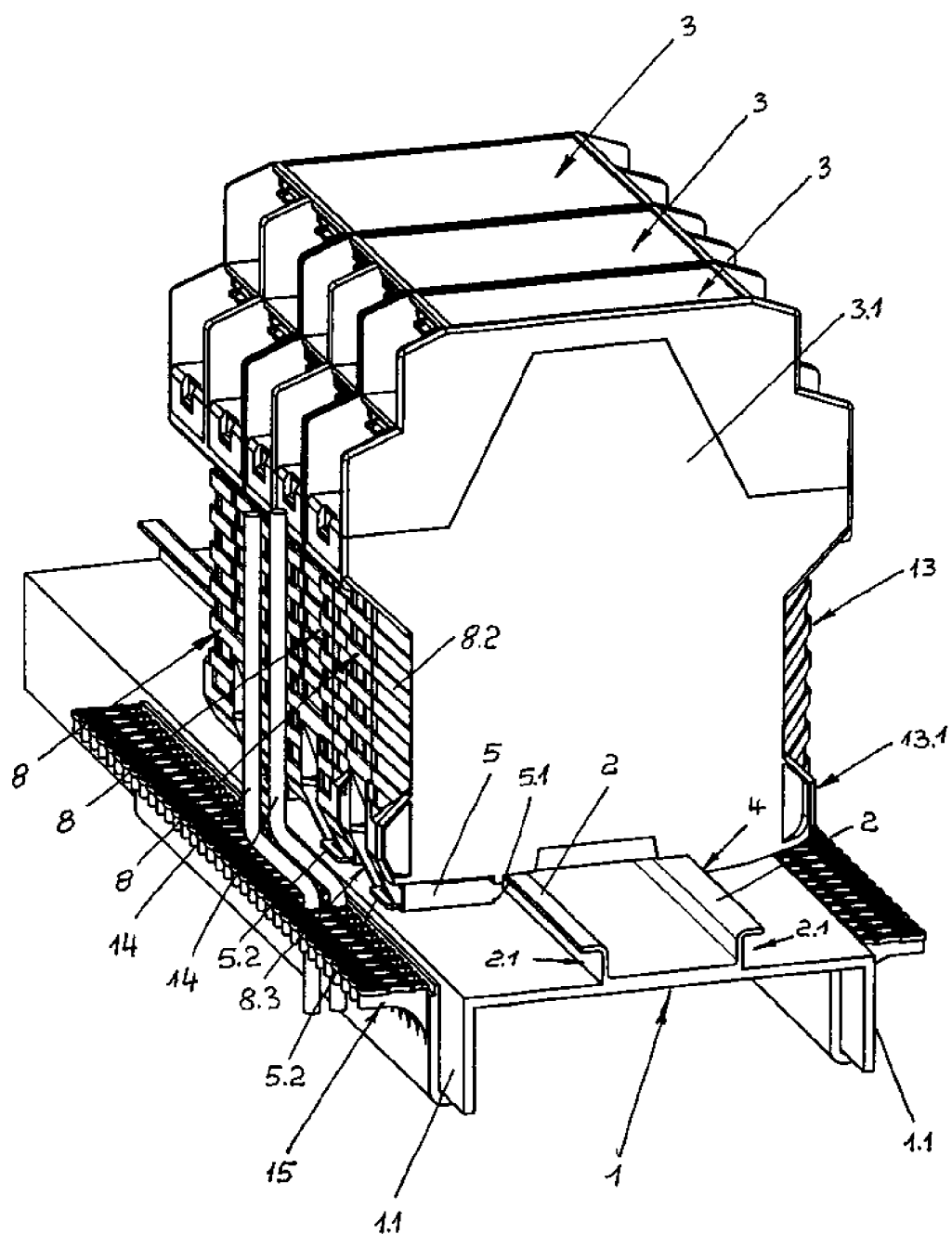
FIG. 2 different perspective view of a carrier rail with two electronic-component housings wired in series placed on it with indicated wiring routing.

Depending on length, a number, or even a large number, of electronic-component housings 3 in which electronic components are routinely placed on a circuit board may be mounted. As FIG. 2 shows clearly, the electronic-component housings 3 are so positioned that their face sides 3.1 are adjacent. Attachment of the electronic-component housings 3 onto the carrier rail 1 is by means of interlocking profiles 4 formed firmly on the underside of the housing that engage into the interlocking aperture 2.1 of the one interlocking profile 4 on the carrier rail 1. A securing lock 5 is positioned at a distance from the interlocking spars 2 and across from the interlocking profile affixed to the housing on the underside of the electronic-component housing 3 that may be displaced along the depth dimension of the electronic-component housing 3. This securing lock 5 is loaded along the direction toward the interlocking profile 4 formed firmly on the underside of the housing by means of a spring, preferably a pressure spring, whereby the securing lock 5 is held in an inner final position (the secured position). On its face side facing the interlocking profile 4, the securing lock 5 includes engaging teeth 5.1 with a leading incline that allows the electronic-component housing to engage with the second interlocking spar 2 on its own when it is emplaced on the carrier rail 1. During this, the engaging teeth 5.1 of the securing lock 5 interlock independently into the interlocking profile 2.1 of this interlocking spar 2.

In order to be able to remove each electronic-component housing 3 from the carrier rail 1, it is necessary to displace the securing lock 5 outward away from the interlocking spar 2 until its engaging tooth 5.1 is free beneath the interlocking spar 2. For this, one uses a tool 7, namely the blade 7.1 of a screwdriver, by means of which it may engage with the drawbar eye 6 of the securing lock 5 shown in FIGS. 3 and 4. The problem here is for the blade 7.1 of the screwdriver 7 to engage not only with the drawbar eye 6 of the securing lock 5, but rather to perform a rocker-arm motion with the screwdriver 7 based on which the securing lock 5 is displaced outward.

As may be taken from FIG. 2, there exist wiring systems for the components contained within the electronic-component housing 3 that require that the individual conductors 14 be routed very close to the side walls 8 along the width dimension of the electronic-component housing 3. Securing devices 15 are positioned along the longitudinal sides 1.1 of the carrier rail 1 to hold and arrange the conductors 14 whose upper sides are positioned approximately at the same level as the upper side of the carrier rail 1, and through which the conductors 14 are fed in the vertical direction. Thus, directly above the upper side of the carrier rail 1, access to the drawbar eye 6 of the securing lock 5 at the electronic-component housings 3 is made more difficult. In order to achieve accessibility, the electronic-component housings 3 are made narrower in at least their lower areas adjacent to the carrier rail 1, i.e., the depth dimension is shortened. This allows corresponding adaptation measures for the securing locks 5, whose interaction with the standardized carrier rail 1 must not be reduced.

As FIGS. 1 and 2 show, the housing side walls 8 along the width dimension extend above the securing lock 5 and the housing side walls 33 opposite them along the depth dimension above the interlocking profile 4 formed as part of the housing in a plane parallel to the carrier rail 1 in installed position that is perpendicular to the upper side of the carrier rail 1 and is recessed with respect to the adjacent longitudinal side 1.1 of the carrier rail 1. For stability reasons, the housing side walls 8 are ribbed and are connected with corner walls 8.2 that are also ribbed and extend obliquely to the faces of the housing 3.1. Across from each housing side wall 8, the drawbar eye 6 is located on the outer end of the securing lock 5 for engagement by the screwdriver 7, recessed even further from the longitudinal side 1.1 of the carrier rail 1, and lies behind the plane extending from the lower area 8.1 of the housing side wall 8 when the securing lock 5 is in secured position, which FIG. 4 particularly shows. In order to be able to reach the drawbar eye 6 of the securing lock 5 in this position with the screwdriver, a guide channel 9 is formed in the housing side wall 8 that extends not only over the lower area 8.1 of the housing side wall 8, but also crosses a lowermost wall section 8.3 which is positioned deep for this purpose.

Figure 3:
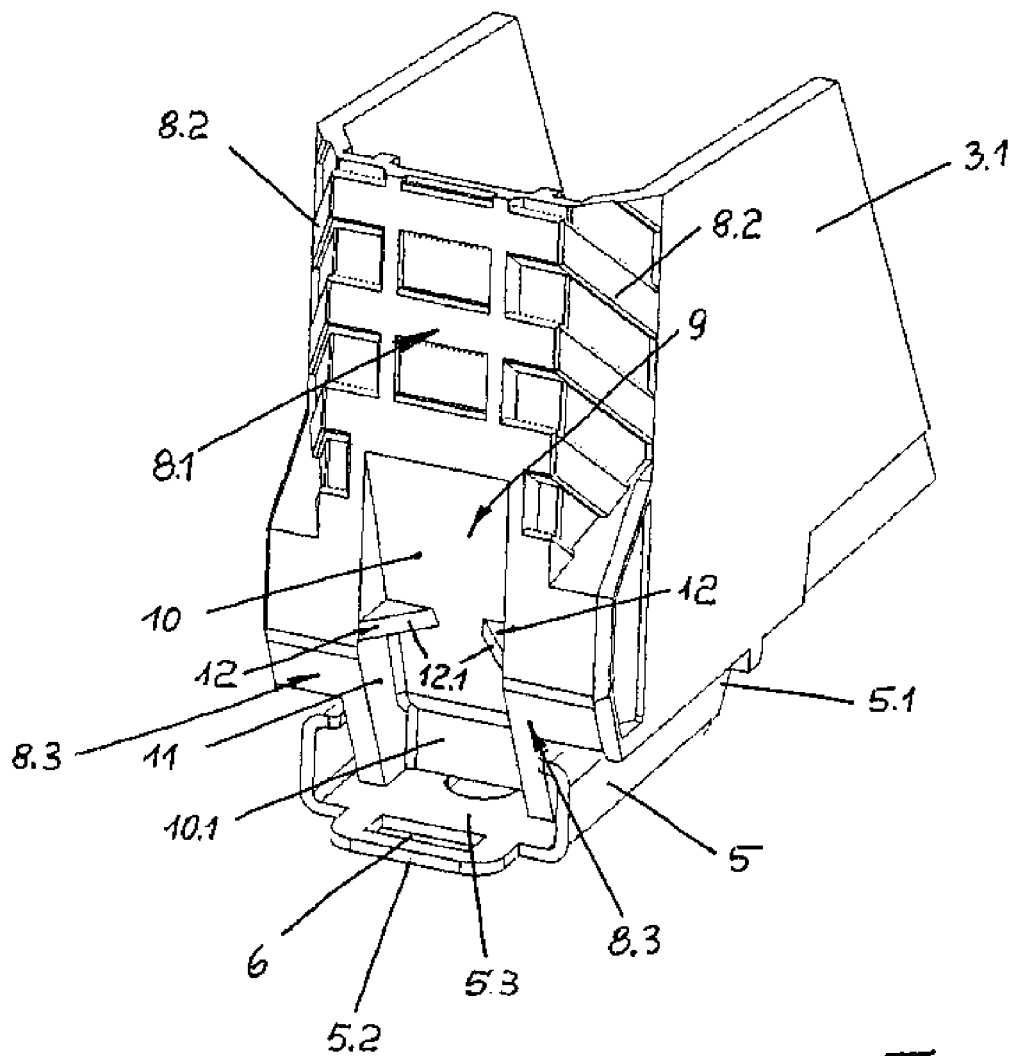
FIG. 3 perspective view of the lower area of the side wall of one of the electronic-component housings.

As FIG. 3 shows, the tool guide channel 9 is so formed in the housing side wall 8 at its lower area 8.1 and the wall section 8.3 adjacent and below it that it includes an increasing depth dimension toward the securing lock 5. The guide channel 9 possesses a rectangular cross section, and includes channel side walls 11 perpendicular to the channel floor 10. Across from the upper area of the channel floor 10 is its lower area 10.1 formed in the wall section 8.3 and also springing back inwards. This results on the underside of the wall section 8.3 in a lower, widened mouth are of the guide channel 9 along which the securing lock 5 may be displaced with its plate-shaped back part 5.3, in which the drawbar eye 6 is formed, lying below. The lower wall section 8.3 is connected to the lower area 8.1 of the housing side wall 8 at an obtuse angle, which means that the outer surfaces of the wall section 8.3 and the lower wall areas 8.1 located above it are at an angle of greater than 180°. The decisive factor is that the wall section 8.3 is inclined toward the plane extending from the lower area 8.1 of the housing side wall 8. Thus, the underside or lower edge of the wall section 8.3 is offset to the rear from the plane of the lower wall section 8.1.

Figure 4:
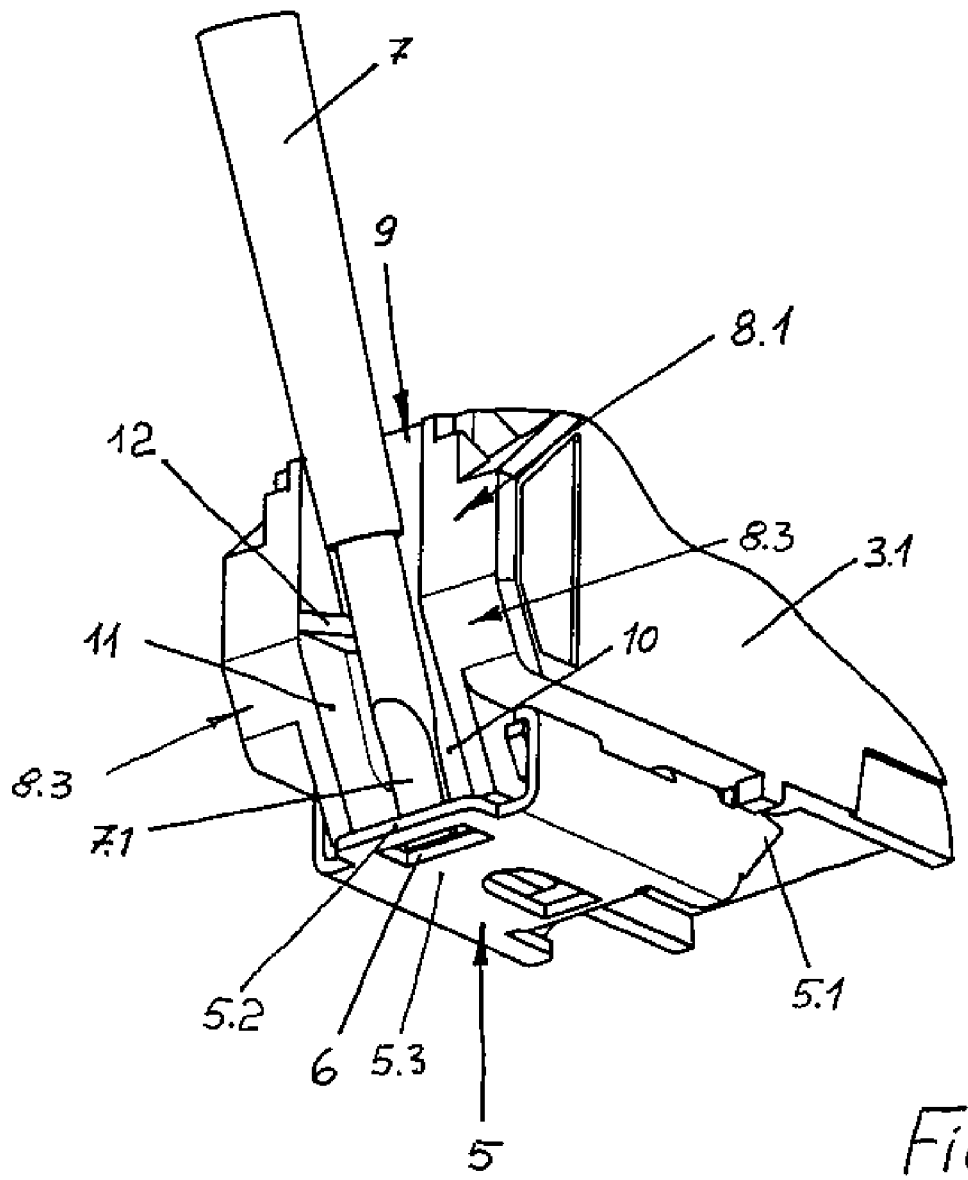
FIG. 4 a view corresponding to FIG. 3 of the electronic-component housing with a tool applied to the securing lock.

FIG. 3 shows the securing lock 5 in its final position (pulled outward), while it is in its secured position in FIG. 4. In this secured position, the drawbar eye 6 of the securing lock 5 is located at the lower mouth area of the guide channel 9. In this position the outer end 5.2 of the securing lock 5, on which the drawbar eye 6 is located, is located offset inward from the plane extending from the housing side wall 8 or from its lower area 8.1.

As FIG. 4 further shows, the blade 7.1 of the screwdriver 7 may be brought into engagement with the drawbar eye 6 through the guide channel 9. In order to be able to displace the securing lock 5 using a levering motion from the secured position shown in FIG. 4 into the final position shown in FIG. 3, spars are provided within the guide channel 9 to reduce its cross section against which the screwdriver blade 7.1 may be supported. The spars 12 possess a triangular cross-section, and extend in such manner between the channel sides 11 and the channel floor 10 that they form support surfaces 12.1 for the screwdriver blade 7.1 with the narrow sides 12.1 converging toward the channel floor 10. The spars 12 are located along the length of the guide channel 9 approximately in the middle of the channel, and possess correspondingly a separation from the drawbar eye 6 on the securing lock 5.

The invention claimed is:

1. An electronic-component housing to be placed onto a carrier rail with two interlocking spars extending longitudinally at a distance from each other and opening toward a longitudinal sides of the rails, to which an interlocking profile firmly affixed to the housing is positioned on an underside of the housing and across from the interlocking profile, at a distance is a displaceable securing lock that is spring-loaded toward the interlocking profile, whereby the securing lock includes on its end away from the interlocking profile a shaped drawbar eye for engagement with an actuation tool, and whereby a housing side wall above the securing lock and extending upward extends at least with its a lower area in a plane perpendicular to a displacement direction of the securing lock, and includes in this area a shaped tool-guide channel with its a mouth pointed toward the drawbar eye on the securing lock, characterized in that a wall section intersects at an obtuse angle inclined along a depth direction on the lower area of the housing side wall as far as the securing lock, and into which the lower section of the guide channel is formed as a recess, whereby an outer end of the securing lock including the drawbar eye is recessed in its secured position behind a plane of the lower area of the housing side wall.

2. The electronic-component housing as in claim 1, characterized in that at a distance from the drawbar eye of the securing lock, at least one spar is positioned in the guide channel and tapered toward a channel opening reducing a guide channel cross section.

3. The electronic-component housing as in claim 1, characterized in that the guide channel possesses a rectangular or square cross section.

4. The electronic-component housing as in claim 2, characterized in that two spars with a triangular cross section are provided across from each other at the same a channel height that extends between channel sides and a channel floor, and form support areas for the actuation tool with their converging narrow sides.

5. The electronic-component housing as in claim 2, characterized in that the guide channel possesses a rectangular or square cross section.

6. The electronic-component housing as in claim 3, characterized in that two spars with a triangular cross section are provided across from each other at the same a channel height that extends between channel sides and a channel floor, and form support areas for the actuation tool with their converging narrow sides.

7. The electronic-component housing as in claim 1, characterized in that two spars with a triangular cross section are provided across from each other at the same a channel height that extends between channel sides and a channel floor, and form support areas for the actuation tool with their converging narrow sides.

* * * * *